(12) United States Patent
Afzali-Ardakani et al.

(10) Patent No.: US 8,293,607 B2
(45) Date of Patent: Oct. 23, 2012

(54) DOPED GRAPHENE FILMS WITH REDUCED SHEET RESISTANCE

(75) Inventors: Ali Afzali-Ardakani, Ossining, NY (US); Ageeth Anke Bol, Yorktown Heights, NY (US); George Stojan Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/859,426

(22) Filed: Aug. 19, 2010

(65) Prior Publication Data

US 2012/0045865 A1 Feb. 23, 2012

(51) Int. Cl.
*H01L 21/336* (2006.01)
(52) U.S. Cl. ........................................ 438/283
(58) Field of Classification Search .............. 438/283
See application file for complete search history.

(56) References Cited

U.S. PATENT DOCUMENTS

| | | | |
|---|---|---|---|
| 5,186,919 A * | 2/1993 | Bunnell | 423/448 |
| 7,253,431 B2 | 8/2007 | Afzali-Ardakani et al. | |
| 2005/0221016 A1 | 10/2005 | Glatkowski et al. | |
| 2006/0038179 A1 | 2/2006 | Afzali-Ardakani et al. | |
| 2008/0001141 A1 | 1/2008 | Gruner et al. | |
| 2008/0170982 A1 * | 7/2008 | Zhang et al. | 423/447.3 |
| 2009/0071533 A1 | 3/2009 | Choi et al. | |
| 2009/0117020 A1 * | 5/2009 | Manthiram et al. | 423/274 |
| 2009/0146111 A1 | 6/2009 | Shin et al. | |
| 2009/0179193 A1 | 7/2009 | Appenzeller et al. | |
| 2011/0017587 A1 * | 1/2011 | Zhamu et al. | 204/157.62 |
| 2011/0089404 A1 * | 4/2011 | Marcus et al. | 257/29 |
| 2011/0165321 A1 * | 7/2011 | Zhamu et al. | 427/79 |
| 2011/0183180 A1 * | 7/2011 | Yu et al. | 429/128 |

FOREIGN PATENT DOCUMENTS

| | | |
|---|---|---|
| WO | WO2008057615 | 5/2008 |
| WO | W02011112589 A1 | 9/2011 |
| WO | W02011112598 A1 | 9/2011 |

OTHER PUBLICATIONS

R. Rathore, A.S.Kumar, S.V. Lindeman, J.K. Kochi; ("Preparation and Structures of Crystalline Aromatic Cation-Radical Salts. Triethyloixonium Hexachloroantimonate, J. Org. Chem." 998, 63, pp. #5847-5856), Department of Chemistry, University of Houston, Houston, Texas, 77204-5641. Mar. 4, 1998.*

(Continued)

*Primary Examiner* — Charles Garber
*Assistant Examiner* — Andre' C Stevenson
(74) *Attorney, Agent, or Firm* — Vazken Alexanian; Michael J. Chang, LLC

(57) ABSTRACT

Techniques for increasing conductivity of graphene films by chemical doping are provided. In one aspect, a method for increasing conductivity of a graphene film includes the following steps. The graphene film is formed from one or more graphene sheets. The graphene sheets are exposed to a solution having a one-electron oxidant configured to dope the graphene sheets to increase a conductivity thereof, thereby increasing the overall conductivity of the film. The graphene film can be formed prior to the graphene sheets being exposed to the one-electron oxidant solution. Alternatively, the graphene sheets can be exposed to the one-electron oxidant solution prior to the graphene film being formed. A method of fabricating a transparent electrode on a photovoltaic device from a graphene film is also provided.

18 Claims, 2 Drawing Sheets

OTHER PUBLICATIONS

Eberlein et al., "Doping of Graphene: Density Functional Calculations of Charge Transfer Between GaAs and Carbon Nanostructures," Phys. Rev. B, 78, 045403-045408 (2008).

Jung et al., "Charge Transfer Chemical Doping of Few Layer Graphenes: Charge Distribution and Band Gap Formation," Nano Letters, vol. 9, No. 12, pp. 4133-4137 (2009).

Kim et al., "Large-Scale Pattern Growth of Graphene Films for Stretchable Transparent Electrodes," Nature, vol. 457, pp. 706-710 (2009).

Li et al., "Transfer of Large-Area Graphene Films for High-Performance Transparent Conductive Electrodes," Nano Letters, vol. 9, No. 12, pp. 4359-4363 (2009).

Li et al., "Large-Area Synthesis of High-Quality and Uniform Graphene Films on Copper Foils," Science, 324, pp. 1312-1314 (2009).

Lu et al., "Tuning the Electronic Structure of Graphene by an Organic Molecule," J. Phys. Chem. B, 113, 2-5 (2009).

Voggu et al., "Effects of Charge Transfer Interaction of Graphene with Electron Donor and Acceptor Molecules Examined Using Raman Spectroscopy and Cognate Techniques," J. Phys. Condens. Matter 20, p. 472204 (2008).

J. Chen et al., "Self-aligned carbon nanotube transistors with charge transfer doping," Appl. Phys. Lett. 86, 123108 (2005).

Lin et al., "Operation of Graphene Transistors at Gigahertz Frequencies," Nano. Lett., 2009, 9 (1), 422-426, Pub Date (Web): Dec. 19, 2008.

D. Kang et al., "Oxygen-induced p-type doping of a long individual single-walled carbon nanotube," Nanotechnology 16 pp. 1048-1052 (2005).

Q.L. Williams et al., "Boron-Doped Carbon Nanotube Coating for Transparent, Conducting, Flexible Photonic Devices," Applied Physics Letters 91, 143116 (2007).

R. Jackson et al., "Stability of Doped Transparent Carbon Nanotube Electrodes," Adv. Funct. Mater. 18, 2548-2554 (2008).

* cited by examiner

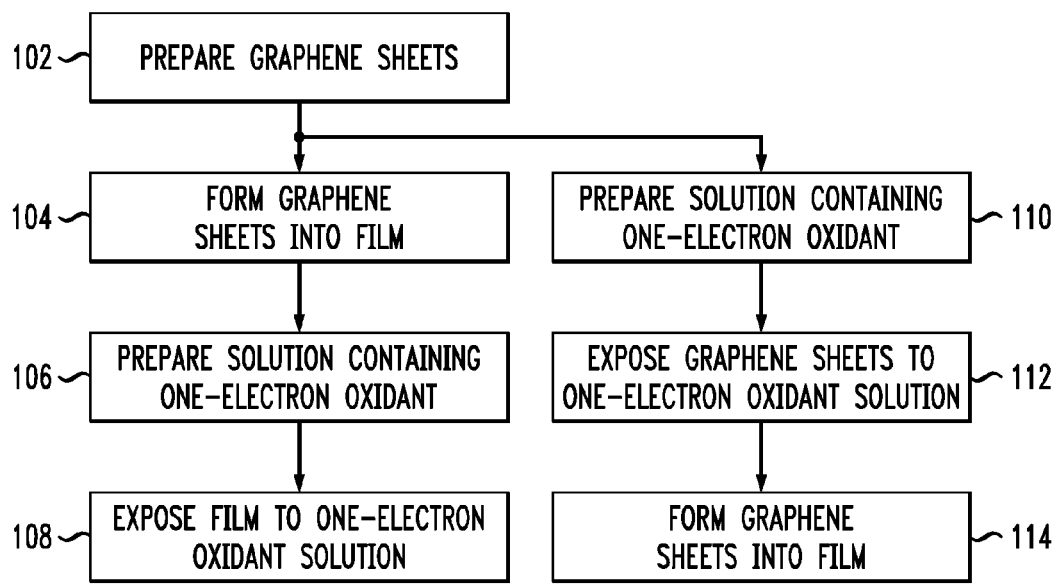

DOPED GRAPHENE FILMS WITH REDUCED SHEET RESISTANCE

FIELD OF THE INVENTION

The present invention relates to graphene, and more particularly, to techniques for increasing the conductivity of graphene films by chemical doping.

BACKGROUND OF THE INVENTION

A conductive transparent electrode is an integral component of a photovoltaic cell. Indium tin oxide (ITO) is currently the most commonly used transparent electrode material. Although ITO offers excellent optical and electrical properties, the fabrication of an ITO electrode involves costly vacuum deposition techniques. ITO (and other metal oxides) also suffer from being brittle, and thus are incompatible with flexible substrates. Further, with the increasing costs of mined metals, ITO is becoming a less economically viable solution for large scale photovoltaic cell production.

Graphene is considered a leading candidate to replace ITO as the transparent electrode material in photovoltaic devices since it can be solution processed, which may significantly drive down the cost of photovoltaic device fabrication and allow for compatibility with virtually any substrates. As-prepared graphene sheets typically have a sheet resistance of from about 250 ohms per square (ohm/sq) to about 4,000 ohm/sq, depending on the fabrication process. To be useful as a transparent electrode material in photovoltaic devices, the sheet resistance of the as-prepared transparent graphene films needs to be reduced.

Two approaches can be pursued to reduce the sheet resistance of graphene: stacking of several graphene films on top of each other and/or chemical doping. Stacking of graphene films essentially adds additional channels for charge transport. However, this approach simultaneously reduces the transparency of the system. See, for example, Li et al., "Transfer of Large-Area Graphene Films for High-Performance Transparent Conductive Electrodes," Nano Letters, vol. 9, no. 12, pgs. 4359-4363 (2009). In addition, since the electronic properties are essentially preserved in the stacked graphene films (SGF), alternative solutions such as doping must also be considered. See, for example, Jung et al., "Charge Transfer Chemical Doping of Few Layer Graphenes: Charge Distribution and Band Gap Formation," Nano Letters, vol. 9, no. 12, pgs. 4133-4137 (2009) (hereinafter "Jung").

Graphene is classified as a semi-metal or zero-gap semiconductor where the density of states vanishes at the Dirac point. Undoped graphene has a low carrier density, and thus high sheet resistance, due to its vanishing density of states at the Dirac point. Due to unintentional dopants the Fermi level most certainly will not reside at the Dirac point of chemical vapor deposition (CVD)-grown graphene films exposed to air, yet chemical doping should still inject sufficient carriers to reduce the resistance of the film. This can be accomplished by injecting charges that result in a shift in the graphene Fermi level without interrupting the conjugated network. See, for example, Jung. Doping of SGF shifts the Fermi level further away from the Dirac point leading to a large increase in the conductivity. See, for example, Voggu et al., "Effects of Charge Transfer Interaction of Graphene with Electron Donor and Acceptor Molecules Examined Using Raman Spectroscopy and Cognate Techniques," J. Phys. Condens. Matter 20, pg. 472204 (2008), Lu et al., "Tuning the Electronic Structure of Graphene by an Organic Molecule," J. Phys. Chem. B, 113, 2-5 (2009) and Eberlein et al., "Doping of Graphene: Density Functional Calculations of Charge Transfer Between GaAs and Carbon Nanostructures," Phys. Rev. B, 78, 045403-045408 (2008). Stacking of graphene sheets leads to a reduction in transparency of the graphene films, which is detrimental for transparent electrodes. Current graphene doping techniques provide dopants that are not stable in time.

Therefore, improved techniques for reducing the sheet resistance of transparent graphene films would be desirable.

SUMMARY OF THE INVENTION

The present invention provides techniques for increasing conductivity of graphene films by chemical doping. In one aspect of the invention, a method for increasing conductivity of a graphene film includes the following steps. The graphene film is formed from one or more graphene sheets. The graphene sheets are exposed to a solution having a one-electron oxidant configured to dope the graphene sheets to increase a conductivity thereof, thereby increasing the overall conductivity of the film. The graphene film can be formed prior to the graphene sheets being exposed to the one-electron oxidant solution. Alternatively, the graphene sheets can be exposed to the one-electron oxidant solution prior to the graphene film being formed. A method of fabricating a transparent electrode on a photovoltaic device from a graphene film is also provided.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating an exemplary methodology for increasing conductivity of a transparent graphene film according to an embodiment of the present invention;

DETAILED DESCRIPTION OF PREFERRED EMBODIMENTS

Figure 2A:
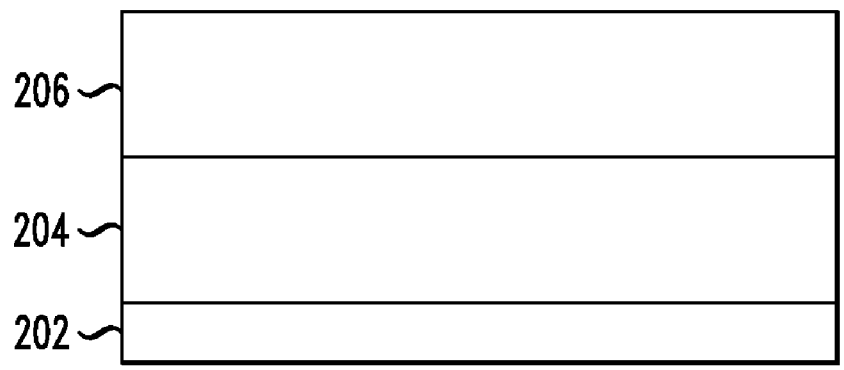
FIG. 2A is a diagram illustrating a photovoltaic device according to an embodiment of the present invention.

Provided herein are techniques for using solution chemistry to heavily dope graphene, thereby reducing the sheet resistance in transparent graphene films by a factor of from about two to about four. FIG. 1, for example, is a diagram illustrating exemplary methodology 100 for increasing conductivity of a transparent graphene film.

In step 102, graphene sheets are prepared using a conventional process. By way of example only, chemical vapor deposition (CVD) onto a metal (i.e., foil) substrate can be used to form the graphene sheets. See, for example, Li et al., "Large-Area Synthesis of High-Quality and Uniform Graphene Films on Copper Foils," Science, 324, pgs. 1312-1314 (2009) (hereinafter "Li") and Kim et al., "Large-Scale Pattern Growth of Graphene Films for Stretchable Transparent Electrodes," Nature, vol. 457, pgs. 706-710 (2009) (hereinafter "Kim"), the contents of each of which are incorporated by reference herein. Chemical exfoliation may also be used to form the graphene sheets. These techniques are known to those of skill in the art and thus are not described further herein. As highlighted above, the as-prepared graphene sheets typically have a sheet resistance of from about 250 ohms per square (ohm/sq) to about 4,000 ohm/sq, depending on the fabrication process. As known by those of skill in the art, sheet resistance and conductivity are inversely related to one another, i.e., as sheet resistance decreases conductivity increases, and vice-a-versa. Advantageously, the present teachings provide techniques for reducing the sheet resistance/increasing the conductivity of films formed from these graphene sheets (see below).

In step 104, the graphene sheets are formed into a film. According to an exemplary embodiment, the film is formed by depositing the graphene sheets onto a given substrate, e.g., a photovoltaic device, using conventional lift-off techniques (see, for example, Li and Kim). In general, the sheets are deposited one on top of another to form the film. Thus, by way of example only, the graphene film can comprise a stack of five graphene sheets (also called layers). The term "substrate" is used to generally refer to any suitable substrate on which one would want to deposit a graphene film. By way of example only, the substrate can be a photovoltaic device, on which the carbon nanotube film is deposited as a transparent electrode material.

In step 106, a solution is prepared containing a one-electron oxidant in a solvent. According to an exemplary embodiment, the one-electron oxidant is triethyloxonium hexachloroantimonate. Suitable solvents include, but are not limited to, one or more of methylene chloride, dimethylformamide (DMF), chloroform and acetone. A typical preparation involves adding 10 milligrams (mg) of the one-electron oxidant to 10 milliliters (ml) of solvent. The solution is stirred or sonicated until the one-electron oxidant completely dissolves into the solution.

In step 108, the transparent graphene film is exposed to the one-electron oxidant solution. According to an exemplary embodiment, the film is soaked in the one-electron oxidant solution for a duration of at least about 10 minutes, e.g., for a duration of about 30 minutes. By way of example only, if the film is being used as a transparent electrode material for a photovoltaic device, then the film can first be deposited on the device and the device with the film exposed to (e.g., soaked in) the one-electron oxidant solution. After the film is exposed and soaked for a proper length of time, it is simply removed from the solution and rinsed with an appropriate solvent, such as acetone. Exposing the film to the one-electron oxidant solution serves to dope the graphene.

Exposing the graphene film to the one-electron oxidant solution shifts the graphene Fermi level further away from the Dirac point, leading to a large increase in the conductivity and reduction of the sheet resistance without interrupting the conjugated network.

The dopant reduces the sheet resistance by at least a factor of two, i.e., by a factor of from about two to about four. By way of example only, in one exemplary implementation of the present techniques, a five-sheet (layer) thick graphene film on a quartz substrate with a transparency of 83 percent (%) at 550 nanometers (nm) and a sheet resistance of 460 ohm/sq was dipped in a solution of triethyloxonium hexacloroantimonate. Due to doping of the graphene, the sheet resistance dropped to 120 ohm/sq, while the transparancy stayed the same.

Further, advantageously, the doped film has enhanced stability as compared with other doping methods. For example, doped films prepared according to the present techniques remain stable even after several months. In fact, the process should last indefinitely especially if, e.g., the photovoltaic device containing the present doped film is encapsulated in some sort of polymer. The present method is more stable because the metal salts form a charge transfer complex with the graphene that is difficult to reverse.

Alternatively, the graphene sheets can be doped prior to forming them into the film, and achieve the same results. Namely, in step 110, the one-electron oxidant solution, e.g., triethyloxonium hexachloroantimonate in methylene chloride, DMF, chloroform and/or acetone, is prepared. The process for preparing the one-electron oxidant solution was described in detail above.

In step 112, the graphene sheets are exposed to the one-electron oxidant solution. According to an exemplary embodiment, the sheets are soaked in the one-electron oxidant solution for a duration of at least about 10 minutes, e.g., for a duration of about 30 minutes. As described above, exposing the sheets to the one-electron oxidant solution serves to dope the graphene. In step 114, the graphene sheets (now doped) are formed into a film.

Advantageously, if chemical exfoliation is used to produce the graphene sheets (see above), the present techniques are completely solution based, which has enormous cost advantages in photovoltaic fabrication. Namely, the raw materials used in the present process are cheaper (carbon versus indium (see above)), the process is entirely from solution and there is no need for expensive vacuum deposition techniques (see above). Further, the doping procedure is independent of the method of graphene film deposition being used.

Figure 2B:
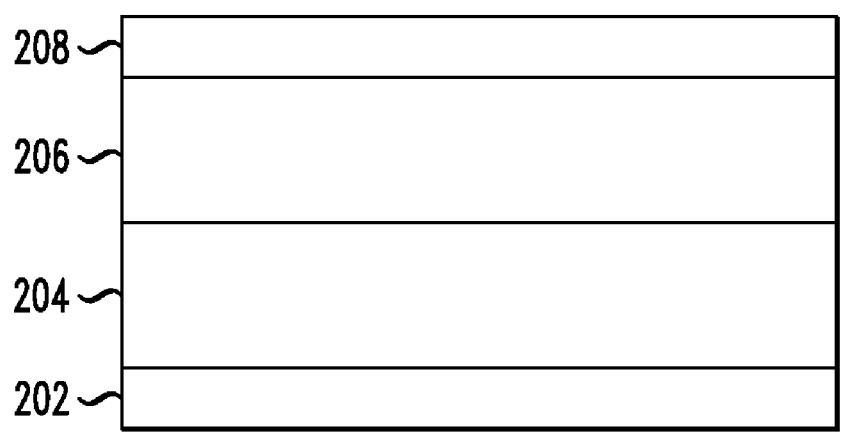
FIG. 2B is a diagram illustrating a graphene film which will serve as a transparent electrode having been formed on a surface of the photovoltaic device according to an embodiment of the present invention.

FIGS. 2A and 2B are diagrams illustrating an exemplary methodology for fabricating a transparent electrode on a photovoltaic device from a transparent graphene film. A generic photovoltaic device is shown in FIG. 2A. The photovoltaic device includes a bottom electrode 202, a first photoactive layer 204 and a second photoactive layer 206. By way of example only, the first and second photoactive layers can be doped so as to have opposite polarities from one another, e.g., one is doped with a p-type dopant and the other is doped with an n-type dopant. In this example, a p-n junction would be formed between the two photoactive layers. Such a generic photovoltaic device would be apparent to one of skill in the art and thus is not described further herein. Further, as would be apparent to one of skill in the art, there are a multitude of different photovoltaic device configurations possible, and the configuration shown in FIG. 2A is provided merely to illustrate the present techniques for fabricating a transparent electrode on the photovoltaic device from a graphene film having increased conductivity.

As shown in FIG. 2B, graphene film 208 which will serve as the transparent electrode is formed on a surface of the photovoltaic device, in this example on a surface of second photoactive layer 206. As described above, the conductivity of the graphene film can be increased by exposing the graphene to a solution containing a one-electron oxidant (e.g., triethyloxonium hexachloroantimonate) either by exposing the individual sheets (i.e., prior to forming the film) or as a film, to dope the graphene. By way of example only, the photovoltaic device with the film formed thereon can be exposed to (e.g., soaked in) the one-electron oxidant solution.

As highlighted above, the graphene film 208 can be formed on the surface of the photovoltaic device in a number of different ways. By way of example only, graphene film 208 can be formed by depositing the graphene sheets onto the surface of the photovoltaic device using wet chemistry.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for increasing conductivity of a graphene film, comprising the steps of:
    forming the graphene film from one or more graphene sheets; and
    exposing the graphene sheets to a solution comprising a one-electron oxidant configured to dope the graphene sheets via charge transfer to increase a conductivity thereof while leaving a conjugated network of the graphene sheets uninterrupted, thereby increasing the overall conductivity of the film.

2. The method of claim 1, wherein the step of forming the graphene film is performed prior to the step of exposing the graphene sheets to the one-electron oxidant solution.

3. The method of claim 1, wherein the step of exposing the graphene sheets to the one-electron oxidant solution is performed prior to the step of forming the graphene film.

4. The method of claim 1, further comprising the step of:
    preparing the solution of the one-electron oxidant in a solvent.

5. The method of claim 4, further comprising the step of:
    stirring the solution until the one-electron oxidant completely dissolves.

6. The method of claim 4, wherein the one-electron oxidant comprises triethyloxonium hexachloroantimonate.

7. The method of claim 4, wherein the solvent comprises one or more of methylene chloride, dimethylformamide, chloroform and acetone.

8. The method of claim 1, wherein the step of exposing the graphene sheets to the one-electron oxidant in solution comprises the step of:
    soaking the sheets in the solution.

9. The method of claim 8, wherein the sheets are soaked in the solution for a duration of about 30 minutes.

10. The method of claim 8, further comprising the step of:
    rinsing the sheets with a solvent after the step of soaking the sheets in the solution is performed.

11. The method of claim 10, wherein the solvent comprises acetone.

12. The method of claim 1, further comprising the step of:
    depositing the graphene sheets on a substrate to form the graphene film.

13. The method of claim 12, wherein the graphene sheets are deposited on the substrate using lift-off techniques.

14. The method of claim 12, wherein the substrate comprises at least a portion of a photovoltaic device.

15. A graphene film having increased conductivity prepared by the method of claim 1.

16. A method of fabricating a transparent electrode on a photovoltaic device from a graphene film, comprising the steps of:
    forming the graphene film from one or more graphene sheets; and
    exposing the graphene sheets to a solution comprising a one-electron oxidant configured to dope the graphene sheets via charge transfer to increase a conductivity thereof while leaving a conjugated network of the graphene sheets uninterrupted, thereby increasing the overall conductivity of the film.

17. The method of claim 16, wherein the step of forming the graphene film is performed prior to the step of exposing the graphene sheets to the one-electron oxidant solution.

18. The method of claim 16, wherein the step of exposing the graphene sheets to the one-electron oxidant solution is performed prior to the step of forming the graphene film.

* * * * *